(12) United States Patent
Uh et al.

(10) Patent No.: US 7,936,331 B2
(45) Date of Patent: May 3, 2011

(54) SHIFT REGISTER AND A DISPLAY DEVICE INCLUDING THE SHIFT REGISTER

(75) Inventors: Kee-Han Uh, Yongin-si (KR); Sang-Jin Pak, Yongin-si (KR); Joo-Hyung Lee, Gwacheon-si (KR); Hyung-Guel Kim, Yongin-si (KR); Myung-Woo Lee, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 966 days.

(21) Appl. No.: 11/411,473

(22) Filed: Apr. 26, 2006

(65) Prior Publication Data

US 2006/0279511 A1 Dec. 14, 2006

(30) Foreign Application Priority Data

Jun. 13, 2005 (KR) .................. 10-2005-0050308

(51) Int. Cl.
*G09G 3/34* (2006.01)
(52) U.S. Cl. ....................................................... 345/100
(58) Field of Classification Search .................... 345/100
See application file for complete search history.

(56) References Cited

U.S. PATENT DOCUMENTS

| 6,690,347 | B2 | 2/2004 | Jeon et al. ............... 345/100 |
| 6,845,140 | B2 | 1/2005 | Moon et al. .............. 377/78 |
| 2004/0189585 | A1* | 9/2004 | Moon ........................ 345/100 |
| 2005/0001805 | A1* | 1/2005 | Jeon et al. ................ 345/92 |

FOREIGN PATENT DOCUMENTS

| CN | 1116752 | 2/1996 |
| CN | 1120210 | 4/1996 |
| CN | 1526141 | 9/2004 |
| JP | 2002-258819 | 9/2002 |
| JP | 2003-248470 | 9/2003 |
| JP | 2004-078172 | 3/2004 |
| JP | 2004-295126 | 10/2004 |
| JP | 2005-037842 | 2/2005 |
| KR | 10-2002-0017530 | 3/2002 |
| KR | 10-2002-0066962 | 8/2002 |
| KR | 10-2003-0095854 | 12/2003 |
| KR | 10-2004-0077191 | 9/2004 |
| KR | 10-2004-0086516 | 10/2004 |

* cited by examiner

*Primary Examiner* — Amr Awad
*Assistant Examiner* — Randal Willis
(74) *Attorney, Agent, or Firm* — F. Chau & Associates, LLC

(57) ABSTRACT

A shift register and a display device having the shift register are provided. The shift register has a plurality of stages which sequentially generate output signals in synchronization with a plurality of clock signals. Each of the stages includes an input unit for receiving a scan start signal or an output signal from a previous stage and outputting the scan start signal or the output signal as a first voltage, a first unit for passing at least two clock signals, a second unit for outputting at least one of the at least two clock signals or a second voltage in response to an output signal from a next stage, and an output unit for generating an output signal synchronized with at least one of the at least two clock signals in response to the outputs of the input unit and the second unit.

21 Claims, 9 Drawing Sheets

SHIFT REGISTER AND A DISPLAY DEVICE INCLUDING THE SHIFT REGISTER

BACKGROUND OF THE INVENTION

1. Technical Field

The present invention relates to a shift register, and more particularly, to a display device having the shift register.

2. Discussion of the Related Art

Recently, the demand for flat panel displays, which are lighter and thinner than traditional television and video displays using cathode ray tubes (CRTs), has increased. Some of the more common flat panel displays include: plasma display panels (PDPs), organic light emitting displays (OLEDs), and liquid crystal displays (LCDs).

PDPs display characters or images using plasma generated by gas-discharge and OLEDs display characters or images by applying an electric field to specific light-emitting organic or high molecule materials. LCDs display images or characters by applying an electric field to a liquid crystal layer disposed between two panels, and regulating the strength of the electric field to adjust a transmittance of light passing through the liquid crystal layer.

The LCD and OLED flat panel displays each include a panel unit provided with pixels including switching elements and display signal lines, and a gate driver for providing a gate signal to gate lines of the display signal lines to turn the switching elements on and off.

Small and medium sized LCDs, for example, are currently being used in portable communications terminals such as folding dual display mobile phones. These so-called dual display devices have display panel units on each of their inner and outer sides.

The dual display device includes a main panel unit mounted on its inner side, a subsidiary panel unit mounted on its outer side, a driving flexible printed circuit film (FPC) provided with signal lines to transmit input signals from external devices, an auxiliary FPC connecting the main panel unit to the subsidiary panel unit, and an integration chip which controls the display device.

In more detail, the integration chip generates control signals and driving signals to control the main panel unit and the subsidiary panel unit. The integration chip is generally mounted on the main panel unit as a chip on glass (COG).

One technique for reducing production cost of the medium and small sized display devices is to form the gate driver with the switching elements to be integrated on the edge of the panel unit.

The gate driver, which is essentially a shift register including a plurality of stages connected to each other in a column, receives, at a first stage, a scan start signal and outputs a gate output, and, at a next stage, receives a carry output and outputs the carry output as a gate output, so that the gate outputs are sequentially generated.

Each of the stages includes a plurality of NMOS or PMOS transistors and at least one capacitor, and generates a gate output having a phase difference of 90° to 180° in synchronization with a plurality of clock signals.

When the transistors are made of an amorphous silicate, the transistors are maintained in a turned-on state after the gate output is generated, so that the voltages applied to the gate lines are maintained at a low voltage. However, since the transistors are turned on for a long time, the threshold voltage of the transistors may increase thus causing the transistors to malfunction.

Currently, the increase in the threshold voltage is alleviated, for example, by using seven transistors. However, in this configuration, when two clock signals having different phases are low, a parasitic capacitance between the gate line and the common electrode provided to an upper panel of the display panels may cause a change in the voltage applied to the gate lines. This change may result in errors which can be particularly pronounced in the medium and small sized display devices when performing low voltage driving.

Accordingly, there is a need for a shift register that is capable of performing low voltage driving without being adversely affected by parasitic capacitance.

SUMMARY OF THE INVENTION

According to an aspect of the present invention, there is provided a shift register having a plurality of stages which sequentially generate output signals in synchronization with a plurality of clock signals, wherein each of the stages includes: an input unit for receiving a scan start signal or an output signal from a previous stage and outputting the scan start signal or the output signal as a first voltage; a first unit for passing at least two clock signals; a second unit for outputting at least one of the at least two clock signals or a second voltage in response to an output signal from a next stage; and an output unit for generating an output signal synchronized with at least one of the at least two clock signals in response to the outputs of the input unit and the second unit.

Each of the stages may have a set terminal, a reset terminal, a gate voltage terminal, and first and second clock terminals, and the input unit may include a first diode connected between the set terminal and a first contact point, the first unit may include a second diode connected between the first clock terminal and a second contact point, and a third diode connected between the second clock terminal and a third contact point.

In addition, each of the stages may have a set terminal, a reset terminal, a gate voltage terminal, an output terminal, and first and second clock terminals, wherein the input unit is connected between the set terminal and a first contact point and includes a first switching element having a control terminal connected to the set terminal. The first unit includes a second switching element connected between the first clock terminal and a second contact point, and a third switching element connected between the second clock terminal and a third contact point, wherein a control terminal of the second switching element is connected to the first clock terminal, and a control terminal of the third switching element is connected to the second clock terminal. The second unit includes fourth and fifth switching elements connected in parallel to each other between the first contact point and the gate voltage terminal, sixth and seventh switching elements connected in parallel to each other between the second contact point and the gate voltage terminal, and an eighth switching element connected between the third contact point and the gate voltage terminal. Control terminals of the fourth and fifth switching elements are connected to the reset terminal and the second contact point, respectively, and control terminals of the sixth, seventh, and eighth switching elements are connected to the first contact point, the second clock terminal, and the first clock terminal, respectively. The output unit includes a ninth switching element connected between the first clock terminal and the output terminal, tenth and eleventh switching elements connected in parallel to each other between the output terminal and the gate voltage terminal, and a capacitor connected between the first contact point and the output terminal, and control terminals of the ninth, tenth, and eleventh switching elements are connected to the first, second, and third contact points, respectively.

In addition, the shift register may include first and second shift register units, wherein the first shift register unit includes a plurality of first stages connected to odd-numbered signal lines, and the second shift register unit includes a plurality of second stages connected to even-numbered signal lines.

Each of the first stages except a first and a last stage may be connected to previous and next first stages, and each of the second stages except a first and a last stage is connected to previous and next second stages.

A first start signal may be input to the first stage of the first register unit and a second start signal is input to the first stage of the second register unit, and the plurality of clock signals may include first and second clock signals input to the first register unit and third and fourth clock signals input to the second register unit, and the first, third, second, and fourth clock signals may have a duty ratio of 25% and a phase difference of 90°.

When the shift register unit includes just a first shift register unit, the plurality of clock signals includes first and second clock signals input to the first register unit, and the first and second clock signals have a duty ratio of 50% and a phase difference of 180°. The output unit charges the capacitor to a difference between the first voltage and the second voltage.

According to another aspect of the present invention, there is provided a display device including a display panel unit having pixels and signal lines connected to the pixels, and a shift register having a plurality of stages which sequentially generate output signals in synchronization with a plurality of clock signals and apply the generated output signals to the signal lines. Each of the stages includes an input unit for receiving a scan start signal or an output signal from a previous stage and outputting the scan start signal or the output signal as a first voltage, a first unit for passing at least two clock signals, a second unit for outputting at least one of the at least two clock signals or a second voltage in response to an output signal from a next stage, and an output unit for generating an output signal synchronized with at least one of the at least two clock signals in response to the outputs of the input unit and the second unit.

Each of the stages may have a set terminal, a reset terminal, a gate voltage terminal, and first and second clock terminals, and the input unit may include a first diode connected between the set terminal and a first contact point. In addition, the first unit may include a second diode connected between the first clock terminal and a second contact point, and a third diode connected between the second clock terminal and a third contact point.

In addition, each of the stages may have a set terminal, a reset terminal, a gate voltage terminal, an output terminal, and first and second clock terminals, wherein the input unit is connected between the set terminal and a first contact point and includes a first switching element having a control terminal connected to the set terminal. The first unit includes a second switching element connected between the first clock terminal and a second contact point, and a third switching element connected between the second clock terminal and a third contact point. A control terminal of the second switching element is connected to the first clock terminal, and a control terminal of the third switching element is connected to the second clock terminal. The second unit includes fourth and fifth switching elements connected in parallel to each other between the first contact point and the gate voltage terminal, sixth and seventh switching elements connected in parallel to each other between the second contact point and the gate voltage terminal, and an eighth switching element connected between the third contact point and the gate voltage terminal. Control terminals of the fourth and fifth switching elements are connected to the reset terminal and the second contact point, respectively, and control terminals of the sixth, seventh, and eighth switching elements are connected to the first contact point, the second clock terminal, and the first clock terminal, respectively. The output unit includes a ninth switching element connected between the first clock terminal and the output terminal, tenth and eleventh switching elements connected in parallel to each other between the output terminal and the gate voltage terminal, and a capacitor connected between the first contact point and the output terminal, wherein control terminals of the ninth, tenth, and eleventh switching elements are connected to the first, second, and third contact points, respectively.

In addition, the first to eleventh switching elements may be made of an amorphous silicate, and the shift register may be integrated in the display panel unit. The shift register may include first and second shift register units, and the first shift register unit may include a plurality of first stages connected to odd-numbered signal lines, and the second shift register unit may include a plurality of second stages connected to even-numbered signal lines.

Further, each of the first stages except a first and a last stage may be connected to previous and next first stages, and each of the second stages except a first and a last stage may be connected to previous and next second stages. A first start signal may be input to the first stage of the first register unit and a second start signal is input to the first stage of the second register unit.

The plurality of clock signals may include first and second clock signals input to the first register unit and third and fourth clock signals input to the second register unit, and the first, third, second, and fourth clock signals may have a duty ratio of 25% and a phase difference of 90°. In addition, the display device may be a liquid crystal display.

When the shift register unit includes just a first shift register unit, the plurality of clock signals includes first and second clock signals input to the first register unit, and the first and second clock signals have a duty ratio of 50% and a phase difference of 180°. The output unit charges the capacitor to a difference between the first voltage and the second voltage.

According to yet another aspect of the present invention, there is provided a pair of shift registers disposed in first and second columns including a first plurality of stages and a second plurality of stages connected to gate lines of a panel unit and receiving first and second start signals, first to fourth clock signals and a gate-off voltage, wherein each of the stages comprises: an input unit connected to a set terminal for receiving one of the start signals or an output from a previous stage and for outputting a first voltage to a first contact point; a first unit connected to first and second clock terminals for passing two of the first to fourth clock signals, wherein the two clock signals have first and second voltage levels, respectively; a second unit connected to a reset terminal for receiving an output from a next stage and for outputting at least one of the two passed clock signals or a second voltage to second and third contact points; and an output unit connected to a gate-off voltage terminal for receiving the gate-off voltage and for outputting a signal synchronized with at least one of the two clock signals according to the voltage of the first, second and third contact points.

When one of the stages generates the output signal in synchronization with the first or second clock signals, the previous and next stages generate an output signal in synchronization with the third or fourth clock signals, respectively.

BRIEF DESCRIPTION OF THE DRAWINGS

The above and other features of the present invention will become more apparent by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail with reference to the attached drawings.

Figure 1:
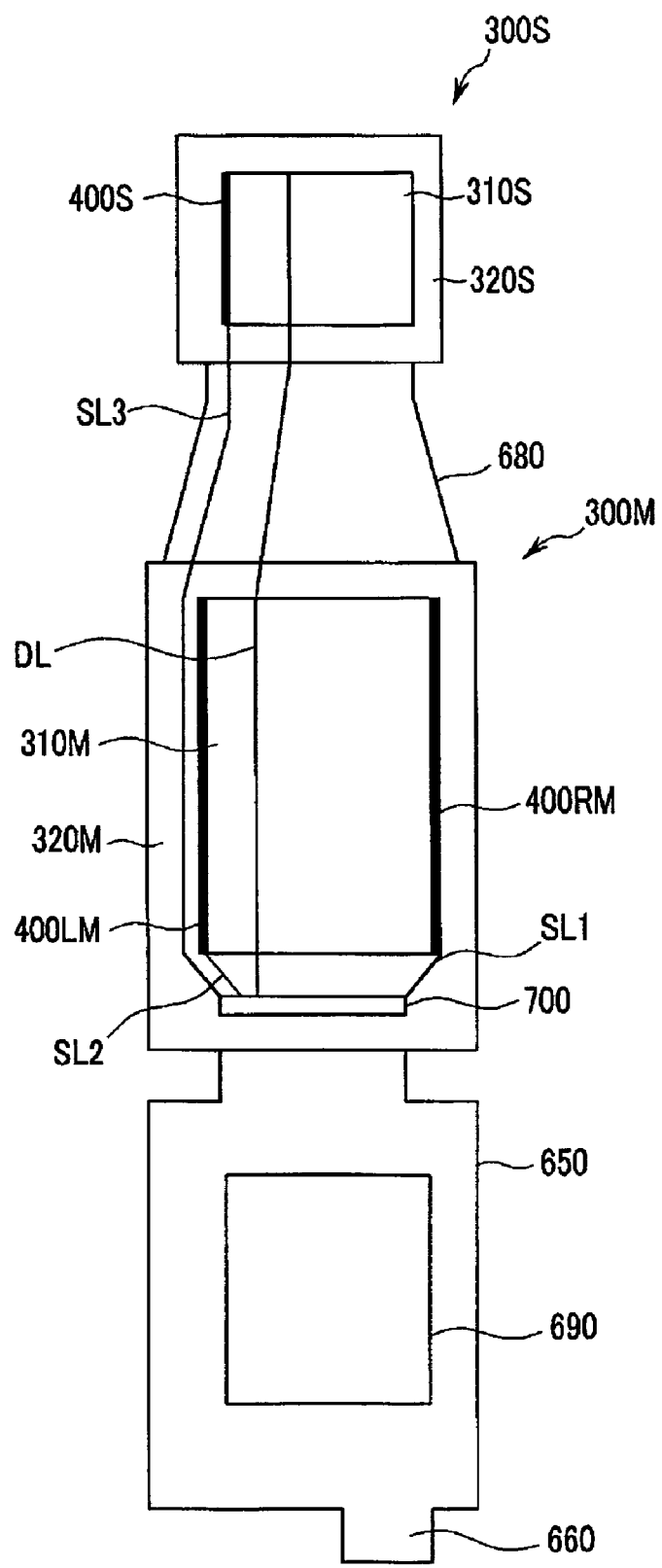
FIG. 1 is a schematic view showing a liquid crystal display device according to an exemplary embodiment of the present invention.
Figure 2:
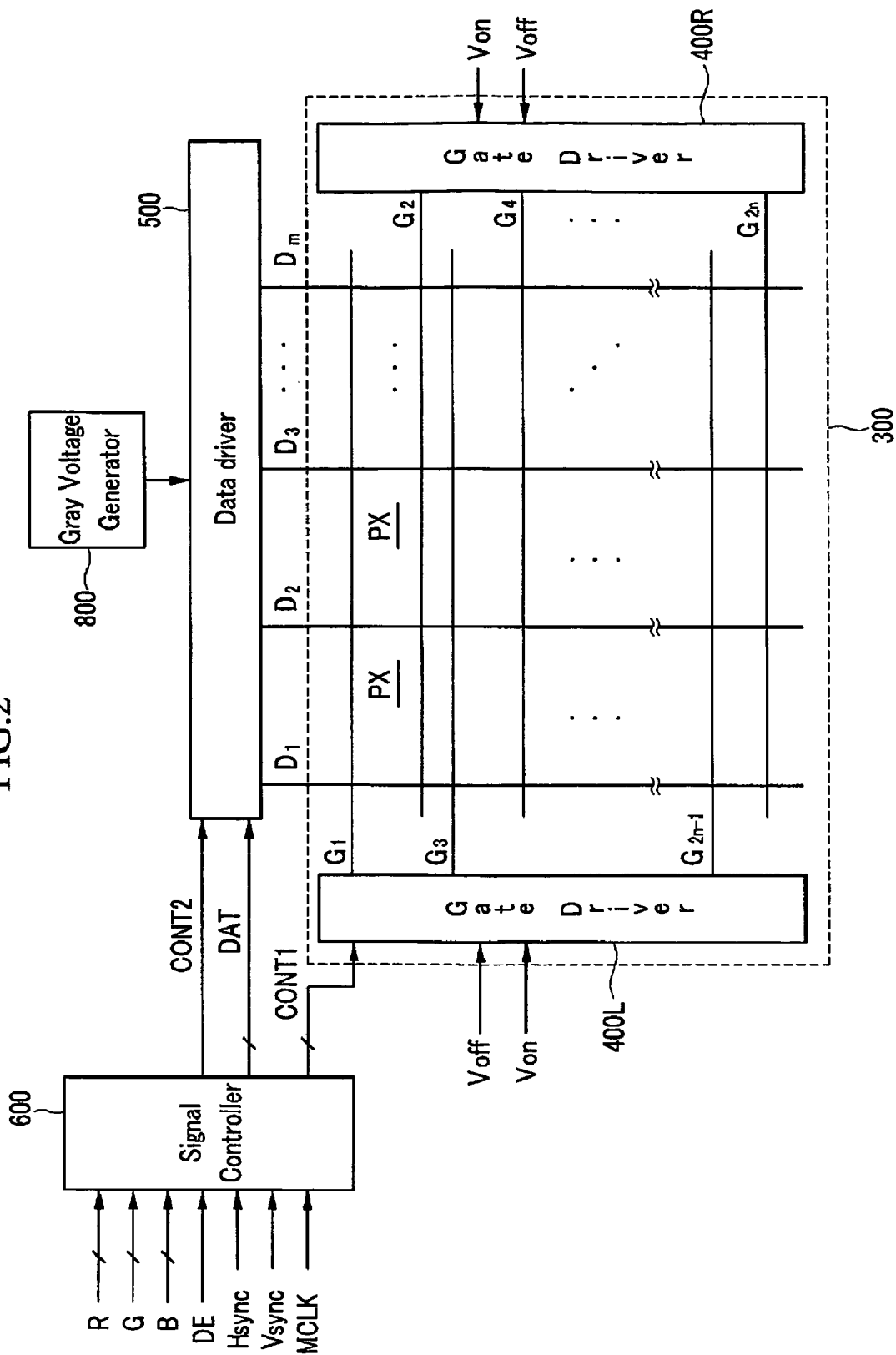
FIG. 2 is a block diagram showing a liquid crystal display device according to an exemplary embodiment of the present invention.
Figure 3:
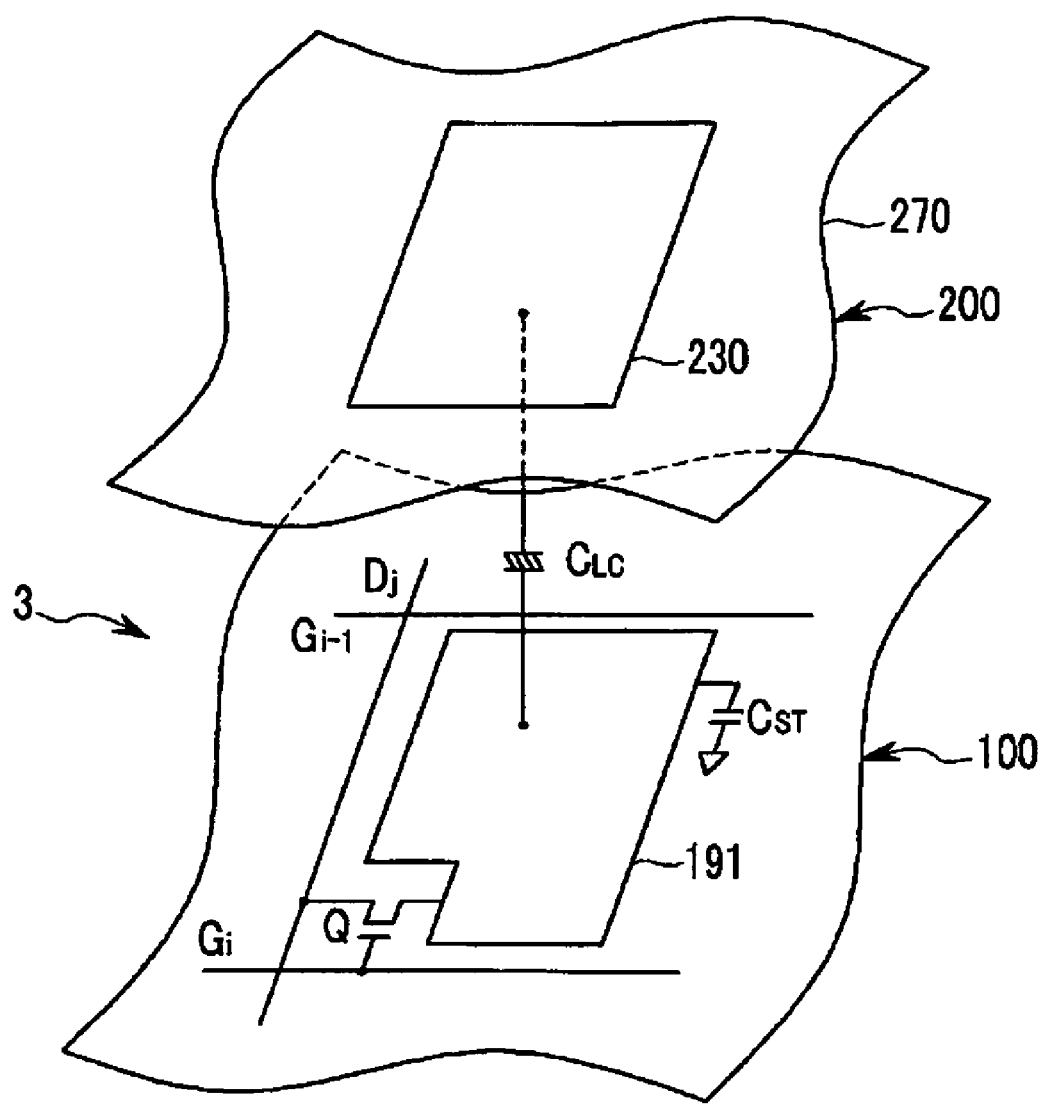
FIG. 3 is an equivalent circuit diagram showing a pixel of a liquid crystal display device according to an exemplary embodiment of the present invention.

FIG. 1 is a schematic view showing a liquid crystal display device according to an embodiment of the present invention, FIG. 2 is a block diagram showing a liquid crystal display device according to an embodiment of the present invention, and FIG. 3 is an equivalent circuit diagram showing a pixel of a liquid crystal display device according to an embodiment of the present invention.

Referring to FIG. 1, the display device includes a main panel unit 300M, a subsidiary panel unit 300S, a flexible printed circuit (FPC) film 650 attached to the main panel unit 300M, an auxiliary FPC 680 attached between the main panel unit 300M and the subsidiary panel unit 300S, and an integration chip 700 mounted on the display panel unit 300M.

The FPC 650 is attached to one side of the main panel unit 300M. In the FPC 650, there is provided an opening portion 690 for exposing a portion of the main panel unit 300M when the FPC 650 is folded in an assembled state. Under the opening portion 690, there is provided an input unit 660 to which external signals are input. In addition, there are provided a plurality of signal lines (not shown) for electrical connection between the input unit 660 and the integration chip 700 and between the integration chip 700 and the main panel unit 300M. In the FPC 650, the signal lines include pads (not shown) positioned at end portions thereof which are used to connect the FPC 650 to the integration chip 700 of the main panel unit 300M.

The auxiliary FPC 680 is attached between the other side of the main panel unit 300M and one side of the subsidiary panel unit 300S, and includes signal lines SL3 and DL for electrical connection between the integration chip 700 and the subsidiary panel unit 300S.

Each of the panel units 300M and 300S includes display regions 310M and 310S constituting screens and peripheral regions 320M and 320S. The peripheral regions 320M and 320S are provided with light shielding layers also known as a black matrix (not shown). The FPC 650 and the auxiliary FPC 680 are attached to the peripheral regions 320M and 320S, respectively.

As shown in FIG. 2, each of the panel units 300M and 300S (shown here as liquid crystal panel unit 300) is connected to a plurality of display signal lines including a plurality of gate lines $G_1$ to $G_{2n}$, and a plurality of data lines $D_1$ to $D_m$, and includes a plurality of pixels PX arranged substantially in a matrix. In addition, each of the panel units 300M and 300S includes gate drivers 400L and 400R for supplying signals to the gate lines $G_1$ to $G_{2n}$. Most of the pixels PX and the display signal lines $G_1$ to $G_{2n}$, $D_1$ to $D_m$ are disposed within the display regions 310M and 310S, and the gate drivers 400RM and 400LM and 400S are disposed in the peripheral regions 320M and 320S, respectively. The peripheral regions 320M and 320S where the gate drivers 400RM, 400LM, and 400S are disposed have larger widths than the display regions 310M and 310S.

In addition, as shown in FIG. 1, some of the data lines $D_1$ to $D_m$ of the main panel unit 300M are connected through the auxiliary FPC 680 to the subsidiary panel unit 300S. For example, the two panel units 300M and 300S share some of the data lines $D_1$ to $D_m$, which are denoted by the signal line DL in FIG. 1.

As shown in FIG. 3, since an upper panel 200 is smaller than a lower panel 100 (of the panel 300), some regions of the lower panel 100 are exposed, and the data lines $D_1$ to $D_m$ extend to the exposed regions to be connected to a data driver 500. In addition, the gate lines $G_1$ to $G_{2n}$ extend to a region covered with the peripheral regions 320M and 320S to be connected to the gate drivers 400RM, 400LM, and 400S.

The display signal lines $G_1$ to $G_n$ and $D_1$ to $D_m$, which include pads (not shown) positioned at end portions thereof to connect the FPCs 650 and 680 and the panel units 300M and 300S, are electrically connected to each other by using anisotropic conductive films (not shown).

Each of the pixels PX, for example, the pixel connected to the i-th gate line $G_i$ (i=1, 2, . . . , n) and the j-th data line $D_j$ (j=1, 2, . . . , m), includes a switching element Q connected to the signal lines $G_i$ and $D_j$, an LC capacitor $C_{LC}$ connected to the switching element Q, and a storage capacitor $C_{ST}$. The storage capacitor $C_{ST}$ may be omitted if it is unnecessary.

The switching element Q is a three-terminal device disposed on the lower panel 100. Control and input terminals of the switching element Q are connected to the gate and data lines $G_i$ and $D_j$, respectively, and an output terminal of the switching element Q is connected to the LC capacitor $C_{LC}$ and the storage capacitor $C_{ST}$.

The terminals of the LC capacitor $C_{LC}$ are connected to a pixel electrode 191 of the lower panel 100 and a common electrode 270 of the upper panel 200. The liquid crystal layer 3 interposed between the two electrodes 191 and 270 serves as a dielectric member. The pixel electrode 191 is connected to the switching element Q, and the common electrode 270 covers the entire surface of the upper panel 200 to receive a common voltage $V_{com}$. Unlike that shown in FIG. 3, the common electrode 270 may be disposed on the lower panel 100, and in this case, at least one of the two electrodes 191 and 270 may be formed in a linear or bar shape.

The storage capacitor $C_{ST}$ having an auxiliary function for the LC capacitor $C_{LC}$ is constructed by overlapping the pixel electrode 191 and a separate signal line (not shown) provided to the lower panel 100 and interposing an insulating member therebetween, and a predetermined voltage such as a common voltage $V_{com}$ is applied to the separate signal line. Alternatively, the storage capacitor $C_{ST}$ may be constructed by overlapping the pixel electrode 191 and a previous gate line disposed thereabove and interposing an insulating member therebetween.

To implement color display, each of the pixels PX uniquely displays one of the primary colors (e.g., spatial division), or each of the pixels PX alternately displays the primary colors according to time (e.g., temporal division). A desired color can be obtained by a spatial or time combination of the primary colors. An example of the primary colors is the three primary colors such as red, green, and blue.

FIG. 3 shows an example of spatial division. As shown in FIG. 3, each of the pixels PX includes a color filter 230 for representing one of the primary colors, which is provided to a region of the upper panel 200 corresponding to the pixel electrode 191. Unlike that shown in FIG. 3, the color filter 230 may be provided above or below the pixel electrode 191 of the lower panel 100.

At least one polarizer (not shown) for polarizing light is attached to an outer surface of the liquid crystal panel unit 300.

Referring now to FIG. 2, a gray voltage generator 800 generates two pairs of gray voltage sets or reference gray voltage sets associated with a transmittance of the pixels PX. One of the two pairs has a positive value with reference to the common voltage $V_{com}$, and the other has a negative value with reference to the common voltage $V_{com}$.

The gate drivers 400RM, 400LM, and 400S are connected to the gate lines $G_1$ to $G_{2n}$ to apply gate signals according to a gate-on voltage Von for turning on the switching element Q and a gate-off voltage Voff for turning off the switching element Q to the gate lines $G_1$ to $G_{2n}$. Here, the gate drivers 400RM, 400LM, and 400S are formed and integrated together with the switching elements Q of the pixel PX by using the same process and are connected through signal lines SL1, SL2, and the signal line SL3 to the integration chip 700, respectively. The gate driver 400S may be disposed at the right side of the subsidiary panel 300S.

The data driver 500 is connected to the data lines $D_1$ to $D_m$ of the liquid crystal panel unit 300 to select the gray voltage transmitted from the gray voltage generator 800 and apply the selected gray voltage as a data signal to the data lines $D_1$ to $D_m$. However, when the gray voltage generator 800 provides a reference gray voltage associated with not all the grays but a predetermined number of grays, the data driver 500 divides the reference gray voltage to generate gray voltages for all the grays and selects the data signals among the generated gray voltages.

A signal controller 600 controls the gate drivers 400R and 400L, the data driver 500, among others.

The integration chip 700 receives external signals through the signal lines provided to the input unit 660 and the FPC 650 and applies processed signals through the signal lines provided to the peripheral region 320M of the main panel unit 300M and the auxiliary FPC 680 to the main panel unit 300M and the subsidiary panel unit 300S to control these components. The integration chip 700 includes the gray voltage generator 800, the data driver 500, and the signal controller 600, among others.

An operation of the display device will now be described.

As shown, for example, in FIG. 2, the signal controller 600 is supplied with image signals R, G, and B, and input control signals. The input control signals, which are received from an external graphics controller (not shown), include, for example, a vertical synchronization signal Vsync, a horizontal synchronization signal Hsync, a main clock MCLK, and a data enable signal DE. After generating gate control signals CONT1 and data control signals CONT2 and processing the image signals R, G, and B for the panel unit 300, in response to the input control signals, the signal controller 600 provides the gate control signals CONT1 to the gate drivers 400R and 400L, and the processed image signals DAT and the data control signals CONT2 to the data driver 500.

The gate control signals CONT1 include a vertical synchronization start signal STV for informing the gate driver 400L and 400R of a start of a frame, a gate clock signal CPV for synchronizing the timing of the gate-on voltage Von, and an output enable signal OE that controls the duration of the gate-on voltage Von.

The data control signals CONT2 include a horizontal synchronization start signal STH for informing the data driver 500 of the start of a horizontal period, a load signal LOAD or TP for instructing the data driver 500 to apply appropriate data voltages to the data lines $D_1$-$D_m$, and a data clock signal HCLK. The data control signals CONT2 may further include an inversion control signal RVS for reversing the polarity of the data voltages (with respect to the common voltage Vcom).

The data driver 500 receives the processed image signals DAT for a pixel row from the signal controller 600, and converts the processed image signals DAT into analog data voltages in response to the data control signals CONT2 from the signal controller 600. The levels of the analog data voltages are selected from the gray voltages supplied from the gray voltage generator 800

In response to the gate control signals CONT1 from the signal controller 600, the gate drivers 400R and 400L apply the gate-on voltage Von to the gate lines $G_1$-$G_{2n}$, thereby turning on the switching elements Q connected to the gate lines $G_1$-$G_{2n}$.

The data driver 500 applies the data voltages to corresponding data lines $D_1$-$D_m$ for a duration of "one horizontal period" or "1H." This duration is equal to the duration of one periodic cycle of signals such as the horizontal synchronization signal Hsync, the data enable signal DE, and the gate clock signal CPV. The data voltages are then supplied to corresponding pixels via the turned-on switching elements Q.

The difference between the data voltage and the common voltage Vcom applied to a pixel is manifested as a charged voltage of the LC capacitor $C_{LC}$, e.g., a pixel voltage. The liquid crystal molecules have orientations depending on the magnitude of the pixel voltage, and those orientations determine the polarization of light passing through the LC capacitor $C_{LC}$. The polarizers convert light polarization into light transmittance.

By repeating the above-described procedure for each gate line, all gate lines $G_1$-$G_{2n}$ are sequentially supplied with the gate-on voltage Von during a frame, thereby applying the data voltages to all pixels. When one frame finishes and the next frame starts, the inversion control signal RVS is applied to the data driver 500 such that the polarity of the data voltages for the next frame will be reversed (this is referred to as frame inversion). Alternatively, the inversion control signal RVS may be controlled such that the polarity of the data voltages in one frame is reversed for every row (this is referred to as row inversion). In addition, the polarity of the data voltages may be reversed for every column (this is referred to as column inversion).

A display device according to another embodiment of the present invention will now be described with reference to FIGS. 4 to 9.

Figure 4:
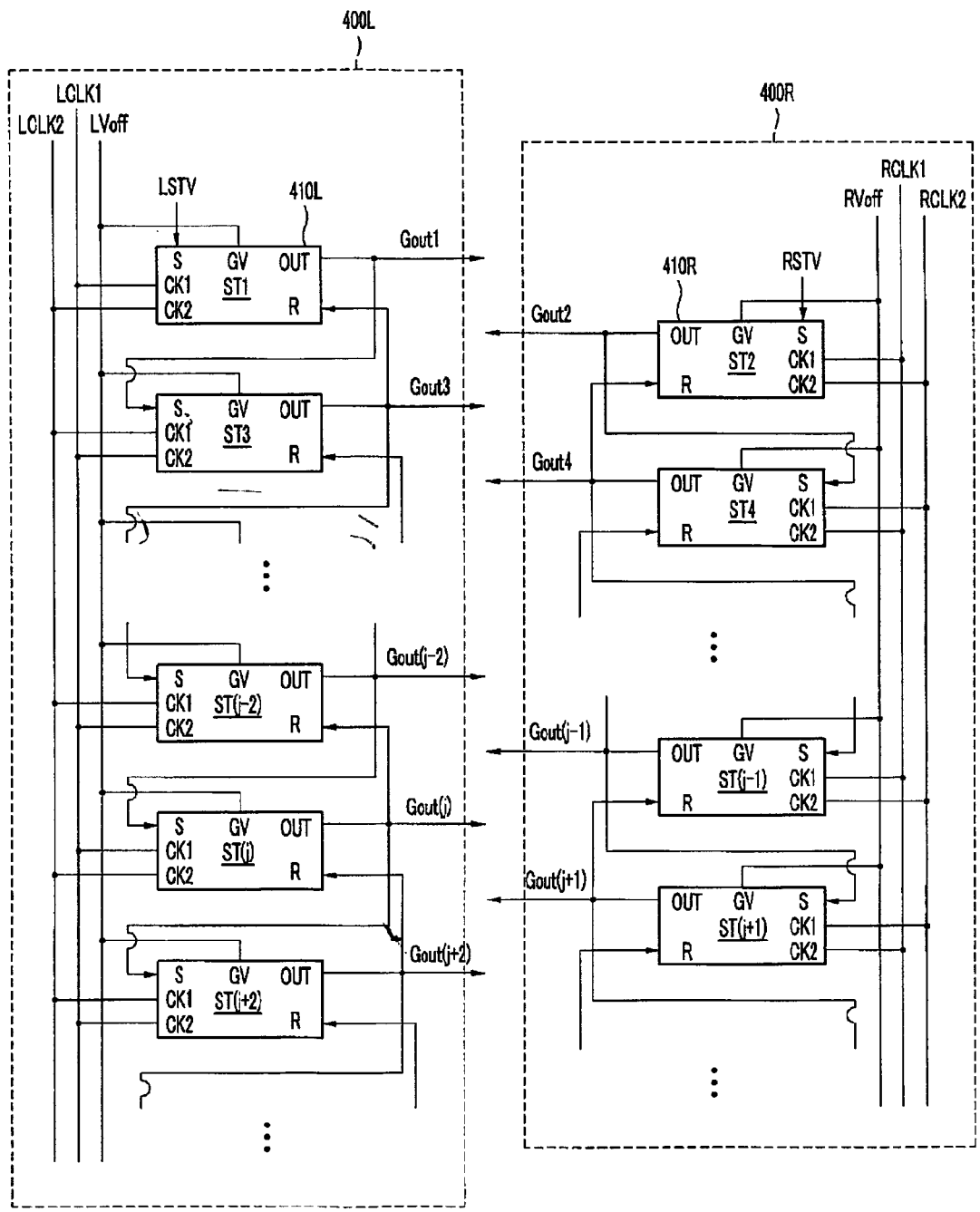
FIG. 4 is a block diagram showing a gate driver according to an exemplary embodiment of the present invention.
Figure 5:
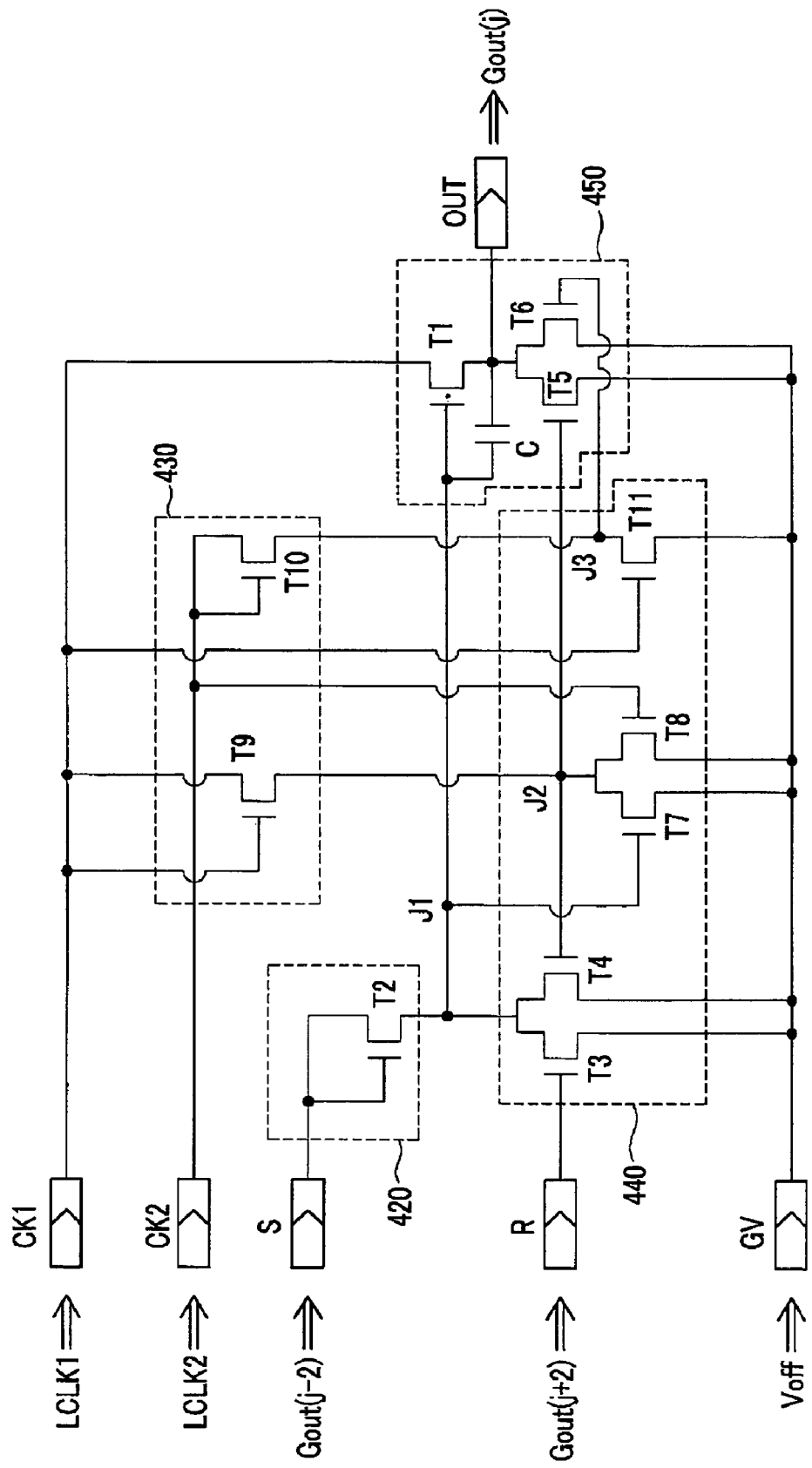
FIG. 5 is a circuit diagram showing a j-th stage of a shift register of the gate driver shown in FIG. 4.
Figure 6:
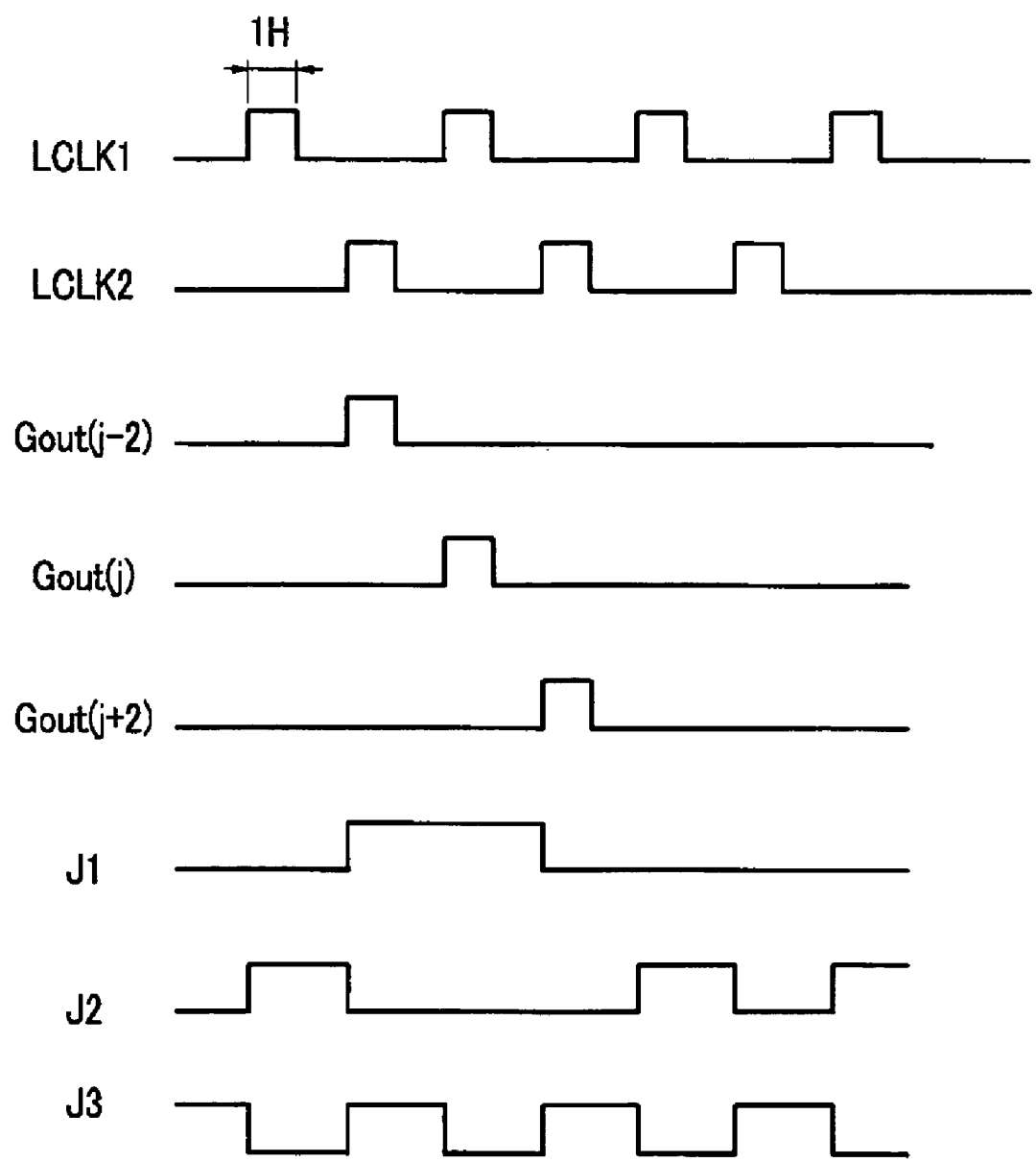
FIGS. 6 and 7 are waveforms of signals of the gate driver shown in FIG. 4.
Figure 7:
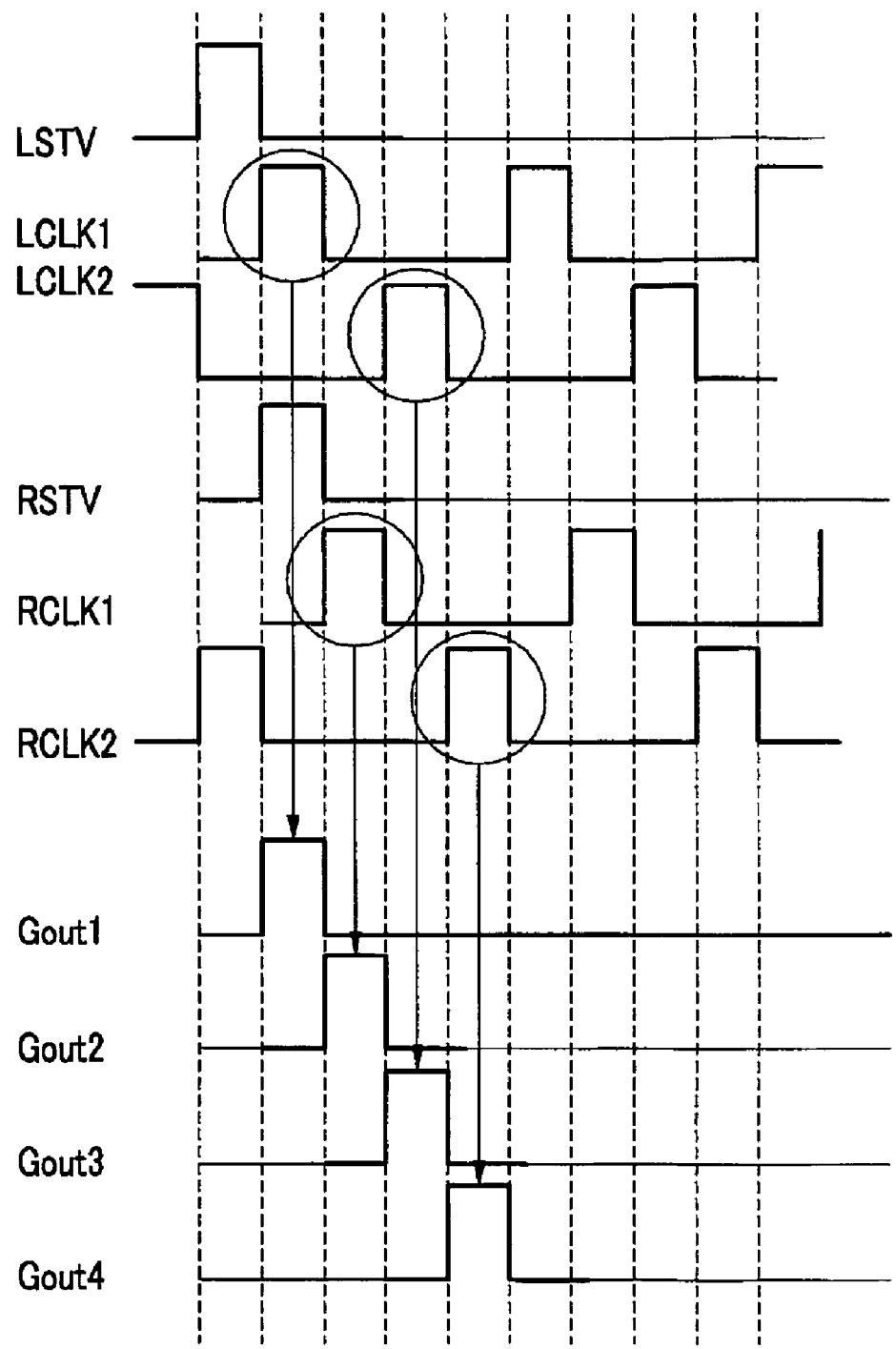

FIG. 4 is a block diagram showing gate drivers according to an embodiment of the present invention. FIG. 5 is a circuit diagram showing a j-th stage of a shift register of the gate drivers shown in FIG. 4, and FIGS. 6 and 7 are waveforms of signals of the gate drivers shown in FIG. 4.

As shown in FIG. 4, the gate drivers 400L and 400R are disposed in left and right columns to constitute shift registers including a plurality of stages 410L and 410R connected to gate lines $G_1$ to $G_{2n}$, respectively, and first and second vertical synchronization start signals LSTV and RSTV, first to fourth clock signals LCLK1, RCLK1, LCLK2, and RCLK2, and a gate-off voltage Voff are input thereto.

Each of the stages 410L and 410R includes a set terminal S, a reset terminal R, a gate voltage terminal GV, an output terminal OUT, and first and second clock terminals CK1 and CK2.

The stages 410L and 410R are formed together with the switching elements Q of the pixels PX and integrated on the same substrate. Odd-numbered stages ST1, ST3, . . . , and ST(2n-1) connected to odd-numbered gate lines $G_1$, $G_3$, . . . , and $G_{2n-1}$, are disposed in the left shift register 400L, and even-numbered stages ST2, ST4, . . . , and ST2n connected to even-numbered gate lines $G_2$, $G_4$, . . . , and $G_{2n}$ are disposed in the right shift register 400R.

In each of the stages 410L and 410R, for example, a j-th stage STj, a gate output of the previous stage ST(j-2), in other words, a previous-stage gate output Gout(j-2) is input to a set terminal S thereof, a gate output of the next stage ST(j+2), in other words, a next-stage gate output Gout(j+2) is input to a reset terminal R thereof, and first and third clock signals LCLK1 and LCLK2 are input to clock terminals CK1 and CK2 thereof. The output terminal OUT transmits the gate output Gout(j) to the gate lines $G_1$, $G_3$, . . . , and $G_{(2n-1)}$ and the previous and next stages 410L. A separate output terminal for transmitting a carry signal output to the previous and next stages may be provided, and a buffer connected to the output terminal OUT may also be provided.

In summary, each of the stages 410L and 410R generates a gate output based on the previous-stage gate output Gout(j-2) and the next-stage gate output Gout(j+2) in synchronization with the clock signals LCLK1, RCLK1, LCLK2, and RCLK2.

Here, instead of the previous-stage gate output, the vertical synchronization start signals LSTV and RSTV are input to the first stages ST1 and ST2 of the shift registers 400L and 400R. The first vertical synchronization start signal LSTV input to the left shift register 400L and the second vertical synchronization start signal RSTV input to the right shift register 400R are 1-frame-period signals which include one of a plurality of pulses having a width of 1H in one frame. The second vertical synchronization start signal RSTV is a signal that is delayed by 1H from the first vertical synchronization start signal LSTV. The first to fourth clock signals LCLK1, RCLK1, LCLK2, and RCLK2 have a duty ratio of 25%, a period of 4H, and a phase difference of 90° between the adjacent clock signals.

At this time, when the first and third clock signals LCLK1 and LCLK2 are input to the clock terminals CK1 and CK2 of the j-th stage ST(j), respectively, the third and first clock signals LCLK2 and LCLK1 are input to the clock terminals CK1 and CK2 of the adjacent (j-2)-th and (j+2)-th stages ST(j-2) and ST(j+2), respectively.

To drive the switching element Q of the pixel PX, each of the clock signals LCLK1, RCLK1, LCLK2, and RCLK2 has high and low voltage levels equal to gate-on and gate-off voltages Von and Voff, respectively.

Referring to FIG. 5, each of the stages of the gate drivers 400R and 400L, for example, the j-th stage, includes an input unit 420, a pull-up driver 430, a pull-down driver 440, and a gate and carry output unit 450. These components are constructed with at least one NMOS transistor T1 to T11 and a capacitor C. Alternatively, PMOS transistors may be used. In addition, the capacitor C may be a parasitic capacitance formed between a gate and source/drain in a manufacturing process.

For the convenience of description, the voltage corresponding to the high level of the clock signals LCLK1, RCLK1, LCLK2, and RCLK2 is referred to as a high voltage, and the voltage corresponding to the low level of the clock signals LCLK1, RCLK1, LCLK2, and RCLK2 is referred to as a low voltage, the intensity of which is equal to that of the gate-off voltage Voff.

The input unit 420 includes a transistor T2 connected to the set terminal S, and input and control terminals of the transistor T2 are commonly connected to the set terminal S to serve as a diode and output the high voltage to a contact point J1.

The pull-up driver 430 includes two transistors T9 and T10, of which input and control terminals are commonly connected to each of the clock terminals CK1 and CK2. The transistors T9 and T10 also serve as diodes and output the high voltage to contact points J2 and J3, respectively.

The pull-down driver 440 includes transistors T3, T4, T7, T8, and T11 which output the low voltage to the contact points J1, J2, and J3. A control terminal of the transistor T3 is connected to the reset terminal R, and a control terminal of the transistor T4 is connected to the contact point J2. Control terminals of the transistors T7, T8, and T11 are connected to the contact point J1, the second clock terminal CK2, and the first clock terminal CK1, respectively.

The output unit 450 includes transistors T1, T5, and T6 and a capacitor C which are connected between the first clock terminal CK1 and gate-off voltage terminal GV to selectively output the first clock signal LCLK1 and low voltage according to the voltage of the contact points J1, J2, and J3. The control terminal of the transistor T1 is connected to the contact point J1 and connected through the capacitor C1 to output terminal OUT. A control terminal of the transistor T5 is connected to the contact point J2, and a control terminal T6 of the transistor T6 is connected to the contact point J3. The contact points J2 and J3 of the two transistors T5 and T6 are connected to the output terminal OUT.

An operation of the j-th stage of the shift register shown in FIG. 5 will be described with reference to FIGS. 6 and 7.

When the j-th stage STj generates the gate output in synchronization with the first clock signal LCLK1, the previous and next stages ST(j-2) and ST(j+2) generate the gate outputs in synchronization with the third clock signal LCLK2.

If the third clock signal LCLK2 and the previous-stage gate output Gout(j-2) become high, the transistors T2, T8, and T10 are turned on. The transistor T2 transmits the high voltage to the contact point J1 to turn on the two transistors T1 and T7, and the transistor T10 transmits the high voltage to the contact point J3 to turn on the transistor T6. Accordingly, the two transistors T7 and T8 transmit the low voltage to the contact point J2, and the transistor T6 transmits the low voltage to the output terminal OUT. In addition, the transistor T1 is turned on, so that the first clock signal LCLK1 is output to the output terminal OUT. At this time, since the first clock signal LCLK1 has a low voltage, the gate output Gout(j) becomes the low voltage again. At the same time, the capacitor C is charged with a voltage corresponding to a difference between the high and low voltages.

At this time, since the next-stage gate output Gout(j+2) is low, the input of the reset terminal R is also low. Therefore, the transistors T3, T4, and T5 whose control terminals are connected to the reset terminal R and the contact point J2 are in a turned-off state.

If the previous-stage gate output Gout(j-2) and the third clock signal LCLK2 become lower, the contact point J1 is disconnected from the set terminal S, so that a floating state is formed and the high voltage is maintained. Since the first clock signal LCLK1 is still low, the gate output Gout(j) is also maintained as low. At this time, the contact point J3 is disconnected from the third clock signal LCLK2, so that a floating state is formed. Accordingly, as shown in FIG. 6, the previous voltage, in other words, the high voltage, is maintained.

If first clock signal LCLK1 becomes high, the two transistors T9 and T11 are turned on. In this state, the two transistors T9 and T7 are connected in series to each other between the first clock signal LCLK1 and the gate-off voltage Voff. The electrical potential of the contact point J2 is determined based on a resistance value at the time of turning on the two transistors T9 and T7. In addition, the resistance value at the time of turning on the transistor T7 is low to turn off the transistors T4 and T5 whose control terminals are connected to the contact terminal J2. In addition, the low voltage is transmitted through the turned-on transistor T11, so that the contact point J3 becomes low, and the transistor T6 whose control terminal is connected to the contact point J3 is turned off. Therefore, the output terminal OUT is connected to only the first clock signal LCLK1 and is disconnected from the gate-off voltage Voff to output the high voltage. On the other hand, the electric potential of one end of the capacitor C, in other words, the contact point J1, increases by the high voltage. Although the voltage is shown to be equal to the previous voltage in FIG. 6, the actual voltage increases by the high voltage.

If the first clock signal LCLK1 becomes low, the transistors T9 and T11 are turned off, and the contact points J2 and J3 are in a floating state so that the previous voltages are maintained. Since the contact point J1 is also in a floating state, the previous voltage is maintained, and the transistor T1 is maintained in a turned-on state so that the output terminal OUT outputs the first clock signal LCLK1, in other words, a low level.

In addition, since the third clock signal LCLK2 is also low, the transistor T8 is maintained in a turned-off state.

If the next-stage gate output Gout(j+2) becomes high, the transistor T3 is turned on, so that the low voltage is transmitted to the contact point J1. Accordingly, the transistor T1 is turned off, so that the output terminal OUT is disconnected from the first clock signal LCLK1.

At the same time, the third clock signal LCLK2 becomes high, so that the transistor T10 is turned on, and the high voltage is transmitted to the contact point J3. Accordingly, the transistor T6 is turned on, and the output terminal OUT is connected to the gate-off voltage Voff so that the output terminal OUT continuously outputs the low voltage. In addition, since the contact point J2 is in a floating state, the previous voltage, in other words, the low voltage, is maintained.

If the next-stage gate output Gout(j+2) and the third clock signal LCLK2 become lower, all the contact points J1 to J3 are in a floating state, so that the previous voltage is maintained.

In summary, the electric potential of the contact point J1 becomes high when the previous-stage gate output Gout(j−2) becomes high, and is maintained as the high voltage for a time interval of 4H until the next-stage gate output Gout(j+2) becomes high. The voltage of the contact point J2 becomes the low voltage when the third clock signal LCLK1 is high, and the voltage of the contact point J2 becomes the high voltage again after the next-stage gate output Gout(j+2) becomes high and the first clock signal LCLK1 becomes high. The contact point J2 is then alternately connected to and disconnected from the first clock signal LCLK1 and the gate-off voltage Voff, so that the high and low voltages alternately remain for a time interval of 2H. The electric potential of the contact point J3 is maintained as the high and low voltages in a time interval alternating according to the first and third clock signals LCLK1 and LCLK2, respectively.

As shown in FIG. 6, the electric potentials of the contact points J2 and J3 have alternating waveforms having a phase difference of 180° in a time interval excluding the time that the gate outputs Gout(j−1), Gout j, and Gout(j+2) are generated. Therefore, during the time interval that the contact point J2 is the high voltage, the two transistors T4 and T5 whose control terminals are connected to the contact point J2 transmit the low voltage to the contact point J1 and the output terminal OUT, and during the time interval when the contact point J3 is the high voltage, the transistor T6 whose the control terminal is connected to the contact point J3 transmits the low voltage to the output terminal OUT.

Figure 8:
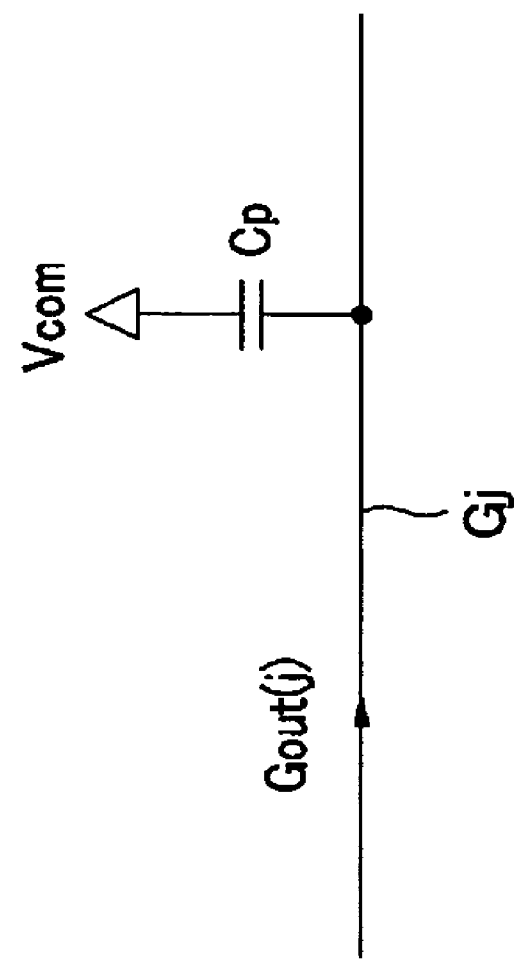
FIG. 8 is a diagram showing parasitic capacitance between a gate line and a common voltage.

Thus, in a time interval excluding the time when the gate output Gout(j) is generated, the output terminal OUT is always connected to the gate-off voltage Voff to output the low voltage. In other words, the gate lines $G_1$ to $G_{2n}$ are not in a floating state, but the gate lines $G_1$ to $G_{2n}$ are always connected to a constant voltage. Therefore, as shown in FIG. 8, a coupling effect caused by the parasitic capacitance Cp between, for example, the j-th gate lines $G_j$ and the common voltage Vcom can be minimized so that a stable gate output can be generated.

Figure 9:
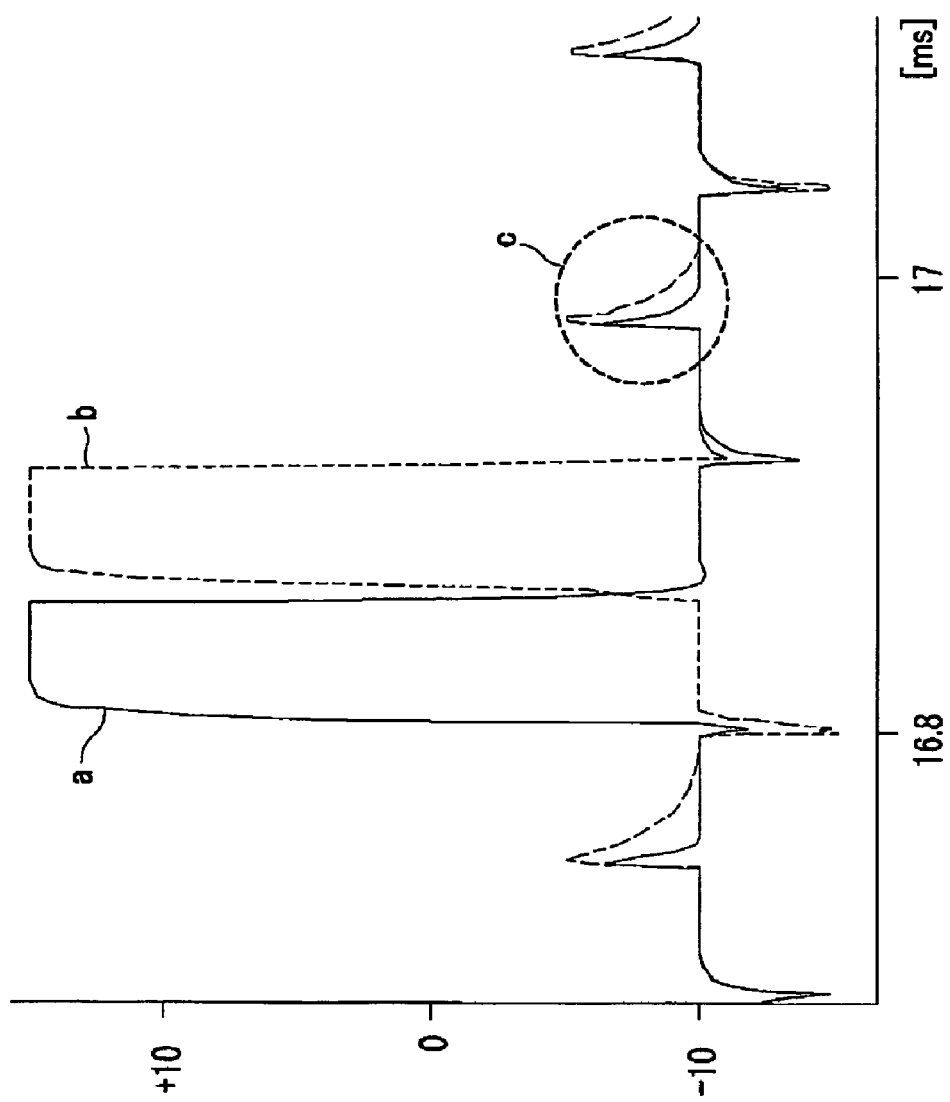
FIG. 9 is a graph for comparing a waveform of a shift register according to an exemplary embodiment of the present invention with a conventional waveform.

FIG. 9 is a graph for comparing a waveform of a gate output a using eleven transistors according to an embodiment of the present invention with a waveform of a conventional gate output b using seven transistors. In FIG. 9, a waveform indicated by the circle c shows a degree of coupling caused by the parasitic capacitance Cp. As can be observed, the gate output a has a lower degree of coupling than the gate output b. This is because one of the electrical potentials of the two contact points J2 and J3 as shown in FIG. 6 is maintained as the high voltage, so that the voltage of the output terminal is always low, even when both of the clock signals LCLK1 and LCLK2 are low.

As described above, with reference to an embodiment of the present invention, since an AC voltage is applied to the transistors T4, T5, and T6, the transistors can be prevented from deteriorating.

In another embodiment of the present invention, a carry output unit having the same construction as the output unit 450 and connected between the first clock signal LCLK1 and the gate voltage terminal GV to perform outputting to the previous and next stages may be provided.

In addition, although dual gate drivers disposed at both sides of the display panel unit 300 are shown, an embodiment of the present invention may be applied to a single gate driver disposed at one side of the display panel unit 300. The construction of the single gate driver can be implemented by setting the duty ratio and the phase difference of the two clock signals, for example, the clock signals LCLK1 and LCLK2 to 50% and 180°, respectively.

Thus, according to an embodiment of the present invention, the transistors T9 and T10 serving as diodes and the transistors T8 and T11 whose control terminals are connected to the clock signals LCLK1 and LCLK2 are provided, to minimize the coupling effect and generate a stable gate output, even when both of the clock signals LCLK1 and LCLK2 or both of the clock signals RCLK1 and RCLK2 are low.

While the present invention has been described in detail with reference to the exemplary embodiments, it is to be understood by those of ordinary skill in the art that various changes in form and details may be made therein without departing from the spirit and scope of the present invention as defined by the appended claims.

What is claimed is:

1. A shift register having a plurality of stages which sequentially generate output signals in synchronization with a plurality of clock signals, wherein each of the stages comprises:
   a set terminal, a reset terminal, a gate voltage terminal, an output terminal and first and second clock terminals;
   an input unit for receiving a scan start signal or an output signal from a previous stage and outputting the scan start signal or the output signal as a first voltage;
   a first unit for passing at least two clock signals;
   a second unit for outputting at least one of the at least two clock signals or a second voltage in response to an output signal from a next stage; and
   an output unit for generating an output signal synchronized with at least one of the at least two clock signals in response to the outputs of the input unit and the second unit,
   wherein the input unit is connected between the set terminal and a first contact point and includes a first switching element having a control terminal connected to the set terminal,
   wherein the first unit comprises:
   a second switching element connected between the first clock terminal and a second contact point; and
   a third switching element connected between the second clock terminal and a third contact point,
   wherein a control terminal of the second switching element is connected to the first clock terminal, and a control terminal and an input terminal of the third switching element are directly connected to the second clock terminal.

2. The shift register of claim 1, wherein the second unit comprises:
   fourth and fifth switching elements connected in parallel to each other between the first contact point and the gate voltage terminal;
   sixth and seventh switching elements connected in parallel to each other between the second contact point and the gate voltage terminal; and
   an eighth switching element connected between the third contact point and the gate voltage terminal,
   wherein control terminals of the fourth and fifth switching elements are connected to the reset terminal and the second contact point, respectively, and control terminals of the sixth, seventh, and eighth switching elements are connected to the first contact point, the second clock terminal, and the first clock terminal, respectively,
   wherein the output unit comprises:
   a ninth switching element connected between the first clock terminal and the output terminal;
   tenth and eleventh switching elements connected in parallel to each other between the output terminal and the gate voltage terminal; and
   a capacitor connected between the first contact point and the output terminal, and
   wherein control terminals of the ninth, tenth, and eleventh switching elements are connected to the first, second, and third contact points, respectively.

3. The shift register of claim 1, wherein the shift register includes first and second shift register units, and
   wherein the first shift register unit includes a plurality of first stages connected to odd-numbered signal lines, and the second shift register unit includes a plurality of second stages connected to even-numbered signal lines.

4. The shift register of claim 3, wherein each of the first stages except a first and a last stage is connected to previous and next first stages, and each of the second stages except a first and a last stage is connected to previous and next second stages.

5. The shift register of claim 4, wherein a first start signal is input to the first stage of the first register unit and a second start signal is input to the first stage of the second register unit.

6. The shift register of claim 5, wherein the plurality of clock signals includes first and second clock signals input to the first register unit and third and fourth clock signals input to the second register unit, and
   wherein the first, third, second, and fourth clock signals have a duty ratio of 25% and a phase difference of 90°.

7. The shift register of claim 1, wherein the shift register unit includes a first shift register unit,
   wherein the plurality of clock signals includes first and second clock signals input to the first register unit,
   wherein the first and second clock signals have a duty ratio of 50% and a phase difference of 180°.

8. The shift register of claim 1, wherein the output unit charges the capacitor with a voltage corresponding to a difference between the first voltage and the second voltage.

9. A display device, comprising:
   a panel unit having pixels and signal lines connected to the pixels, and
   a shift register having a plurality of stages which sequentially generate output signals in synchronization with a plurality of clock signals and apply the generated output signals to the signal lines,
   wherein each of the stages comprises:
   a set terminal, a reset terminal, a gate voltage terminal, an output terminal, and first and second clock terminals,
   an input unit for receiving a scan start signal or an output signal from a previous stage and outputting the scan start signal or the output signal as a first voltage,
   a first unit for passing at least two clock signals,
   a second unit for outputting at least one of the at least two clock signals or a second voltage in response to an output signal from a next stage, and
   an output unit for generating an output signal synchronized with at least one of the at least two clock signals in response to the outputs of the input unit and the second unit,
   wherein the input unit is connected between the set terminal and a first contact point and includes a first switching element having a control terminal connected to the set terminal,
   wherein the first unit comprises:
   a second switching element connected between the first clock terminal and a second contact point; and
   a third switching element connected between the second clock terminal and a third contact point,
   wherein a control terminal of the second switching element is connected to the first clock terminal, and a control terminal and an input terminal of the third switching element are directly connected to the second clock terminal.

10. The display device of claim 9, wherein the second unit comprises:
    fourth and fifth switching elements connected in parallel to each other between the first contact point and the gate voltage terminal;
    sixth and seventh switching elements connected in parallel to each other between the second contact point and the gate voltage terminal; and an eighth switching element connected between the third contact point and the gate voltage terminal, wherein control terminals of the fourth and fifth switching elements are connected to the reset terminal and the second contact point, respectively, and control terminals of the sixth, seventh, and eighth switching elements are connected to the first contact point, the second clock terminal, and the first clock terminal, respectively, wherein the output unit comprises:

a ninth switching element connected between the first clock terminal and the output terminal;

tenth and eleventh switching elements connected in parallel to each other between the output terminal and the gate voltage terminal; and a capacitor connected between the first contact point and the output terminal, and wherein control terminals of the ninth, tenth, and eleventh switching elements are connected to the first, second, and third contact points, respectively.

11. The display device of claim 10, wherein the first to eleventh switching elements are made of an amorphous silicate.

12. The display device of claim 11, wherein the shift register is integrated in the panel unit.

13. The display device of claim 12, wherein the shift register includes first and second shift register units, and wherein the first shift register unit includes a plurality of first stages connected to odd-numbered signal lines, and the second shift register unit includes a plurality of second stages connected to even-numbered signal lines.

14. The display device of claim 13, wherein each of the first stages except a first and a last stage is connected to previous and next first stages, and each of the second stages except a first and a last stage is connected to previous and next second stages.

15. The display device of claim 14, wherein a first start signal is input to the first stage of the first register unit and a second start signal is input to the first stage of the second register unit.

16. The display device of claim 15, wherein the plurality of clock signals includes first and second clock signals input to the first register unit and third and fourth clock signals input to the second register unit, and wherein the first, third, second, and fourth clock signals have a duty ratio of 25% and a phase difference of 90°.

17. The display device of claim 9, wherein the display device is a liquid crystal display.

18. The display device of claim 9, wherein the shift register unit includes a first shift register unit, wherein the plurality of clock signals includes first and second clock signals input to the first register unit, wherein the first and second clock signals have a duty ratio of 50% and a phase difference of 180°.

19. The display device of claim 9, wherein the output unit charges the capacitor with a voltage corresponding to a difference between the first voltage and the second voltage.

20. A pair of shift registers disposed in first and second columns including a first plurality of stages and a second plurality of stages connected to gate lines of a panel unit and receiving first and second start signals, first to fourth clock signals and a gate-off voltage, wherein each of the stages comprises:

an input unit connected to a set terminal for receiving one of the start signals or an output from a previous stage and for outputting a first voltage to a first contact point, the input unit comprising a first switching element comprising a control terminal and an input terminal connected to the set terminal;

a first unit connected to first and second clock terminals for passing two of the first to fourth clock signals, wherein the two clock signals have first and second voltage levels, respectively;

a second unit connected to a reset terminal for receiving an output from a next stage and for outputting at least one of the two passed clock signals or a second voltage to second and third contact points; and an output unit connected to a gate-off voltage terminal for receiving the gate-off voltage and for outputting a signal synchronized with at least one of the two clock signals according to the voltage of the first, second and third contact points, wherein the first unit comprises:

a second switching element connected between the first clock terminal and the second contact point; and a third switching element connected between the second clock terminal and the third contact point, wherein a control terminal and an input terminal of the second switching element are connected to the first clock terminal, and a control terminal and an input terminal of the third switching element are directly connected to the second clock terminal.

21. The shift registers of claim 20, wherein when one of the stages generates the output signal in synchronization with the first or second clock signals, the previous and next stages generate an output signal in synchronization with the third or fourth clock signals, respectively.

* * * * *